United States Patent [19]

Unterricker et al.

[11] Patent Number: 5,652,549

[45] Date of Patent: Jul. 29, 1997

[54] INTEGRATED CIRCUIT RING OSCILLATOR HAVING LINE DRIVER WITH DOUBLE LINE FEEDBACK

[75] Inventors: Reinhold Unterricker, Munich; Bjoern Heppner, Seefeld, both of Germany

[73] Assignee: Siemens Aktiengesellschaft, Munich, Germany

[21] Appl. No.: 609,562

[22] Filed: Mar. 1, 1996

[30] Foreign Application Priority Data

Mar. 28, 1995 [DE] Germany ............... 195 11 401.9

[51] Int. Cl.$^6$ ................... H03B 5/18; H03K 3/86
[52] U.S. Cl. ............... 331/57; 331/99; 331/108 B; 331/108 C; 331/117 D; 331/135; 331/177 R
[58] Field of Search ............ 331/57, 99, 108 B, 331/108 C, 135, 117 D, 117 R

[56] References Cited

U.S. PATENT DOCUMENTS 5,172,076  12/1992  Brown ................... 331/57

FOREIGN PATENT DOCUMENTS

WO95/06356  3/1995  WIPO.

OTHER PUBLICATIONS

Astabile Kippschaltung Mit Umschaltbarer Frequenz, 29 (1980) H.9 Radio Fernsehen Elektronik, p. 596.

IEEE Journal Of Solid–State Circuits, vol. 28, No. 12, Dec. 1993, Mehmet Soyuer, Member IEEE A Monolithic 2.3–Gb/s 100–mW Clock and Data Recovery Circuit in Silicon Bipolar Technology pp. 1310–1313.

IEEE 1991 Bipolar circuits and Technology Meeting 12.4—A High Speed High Jitter Tolerant Clock and Data Recovery Circuit Using Crystal Based Dual PLL–Sam Yinshang Sun pp. 293–296.

Electronics Letters 3rd Feb. 1994 vol. 30 No. 3–1.1GHz Oscillator Using Bondwire Inductance pp. 244–245.

*Primary Examiner*—Siegfried H. Grimm
*Attorney, Agent, or Firm*—Hill, Steadman & Simpson

[57] ABSTRACT

A monolithically integrated oscillator is implemented as ring oscillator with a line driver and a double line formed on one and the same chip. A running time of the double line is selected optimally long and a delay time of the line driver is selected optimally short. The double line can be loaded with controllable capacitors.

11 Claims, 2 Drawing Sheets

INTEGRATED CIRCUIT RING OSCILLATOR HAVING LINE DRIVER WITH DOUBLE LINE FEEDBACK

BACKGROUND OF THE INVENTION

Oscillators working in the frequency range from a few hundred Megahertz up to several Gigahertz are required in many integrated circuits of telecommunications technology. With modern bipolar silicon or MOS semiconductor technologies, such circuits can be integrated on a chip as ring oscillators without external elements (WO 95/06356). The oscillation frequency, however, is greatly dependent on the operating temperature of the chip and on scatter of the semiconductor parameters. The employment of oscillators having less basic precision in, for example, clock recovery circuits therefore requires complicated auxiliary circuits such as reference phase-locked loops (IEEE J. Of Solid-State Circuits, 28 (1993) 12, 1310 . . . 1313) or external components such as quartz crystals (IEEE 1991 Bipolar Circuits and Technology Meeting, 12.4, 293 . . . 296) that make the overall circuit more complex and the structure more expensive. Furthermore, a large tuning range of the oscillator is needed in order to be able to level the initial center frequency error, this leading to increased phase noise (jitter), and also makes it difficult to realize such a circuit at extremely high frequencies (above 5 GHz).

No basic precision that suffices for a clock recovery circuit without a reference phase-locked loop or external balancing can be anticipated even given employment of bond wires as frequency-defining elements of an oscillator (ELECTRONICS LETTERS, 30(1994) 3, 244 . . . 245), due to the manufacturing tolerances in bonding.

SUMMARY OF THE INVENTION

It is an object of the invention to provide a way to a less circuit-intensive, high-precision oscillator.

According to the invention, a monolithically integrated ring oscillator is provided with a line driver and a double line circuit that feeds back. This oscillator provides the double line as an integration having an optimally long running or transit time and a line driver having an optimally short delay time on one and the same chip. In a further development of the invention, the running time of the double line is greater than (and optimally long compared to) the delay time of the line driver. The independence of the oscillator frequency from the parameter-conditioned and temperature-conditioned variations of the delay time of the line driver is all the greater the shorter the delay time of the line driver and the longer the running time of the double line compared thereto.

The invention yields the advantage that the expenditure required for pre-tuning, for example with a reference phase-locked loop, given an employment in clock recovery circuits in the case of ordinary ring oscillators constructed only of inverters (as frequency-defining elements), becomes superfluous.

Let it be noted here that it is known (from Radio Fernsehen Elektronik 29(1980) 9, 596–597) that an oscillator can be designed as an inverting amplifier with a delay line storage unit or delay-time register in the feedback wherein the delay time of which must be at least sufficiently long such that the reaction of the inverter output on the leading edge via the feedback does not begin until after the end of the leading edge. The oscillation frequency, not taking the inverter switching time into account, corresponds to the reciprocal value of the doubled delay time of the delay line storage unit and is proportionately reduced by all time events of the inverter. No teaching whatsoever is provided of an integration of a feedback double line having an optimally long running time and of a line driver with an optimally short delay time on one and the same chip.

DESCRIPTION OF THE PREFERRED EMBODIMENTS

Figure 1:
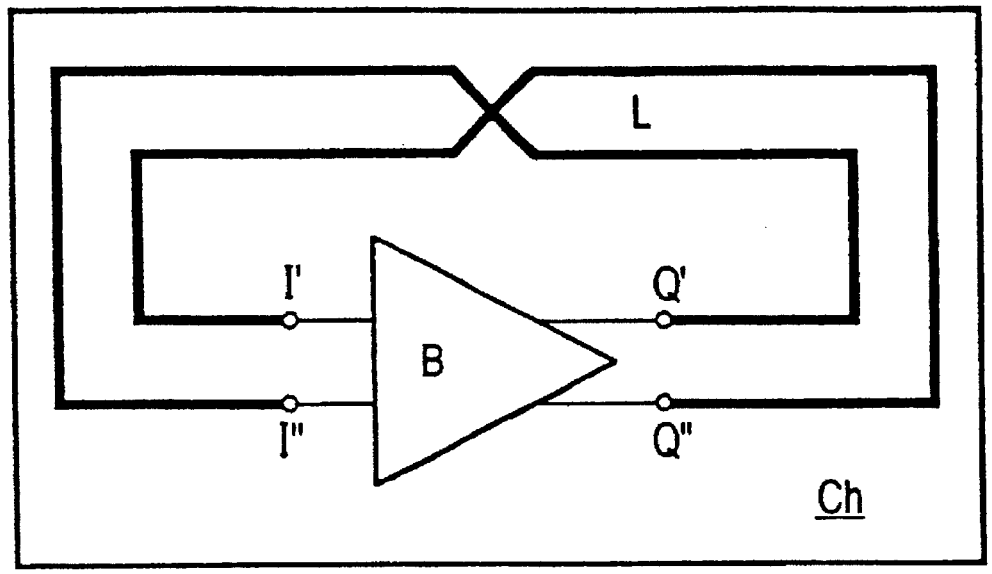
FIG. 1 is a schematic diagram of a line ring oscillator of the invention.

In a scope necessary for an understanding of the invention, FIG. 1 of the drawing schematically shows a line ring oscillator integrated on a chip Ch that has a line driver B and a double line L conducted on the chip that feeds the outputs Q',Q" of the line driver B back to the inputs I',I" thereof in inverted fashion. Such a line ring oscillator can, for example, be realized in Siemens B6HF bipolar technology. The cycle duration of the oscillation that is generated derives as double the sum of the delay time $T_B$ of the line driver B and the running time $T_L$ of the double line L. The running time $T_L$ of the line L is primarily dependent on the very well-reproducible line length and on the hardly divergent dielectric constant of silicon dioxide. The oscillation frequency of the ring oscillator formed in this way is thus hardly dependent at all on temperature and parameter fluctuations. In order to be optimally independent of the parameter-dependent and temperature-dependent delay time $T_B$ of the line driver B, $T_B$ should be optimally small and $T_L$ should be optimally great.

For example, the line driver B can be fed back by an approximately 7 mm long double line for generating a 5 Ghz oscillation, this double line L, formed of 2 μm wide aluminum tracks with a mutual spacing of 2 μm, proceeding (particularly in a third Al layer) over a metal surface (potentially a first Al layer) lying at ground potential and has a characteristic impedance of about 50 Ohms. The running time amounts to approximately 70 ps. After a cross-over, the line leads to the input of the line driver B, which has a delay time of about 30 ps in the example being considered.

Figure 2:
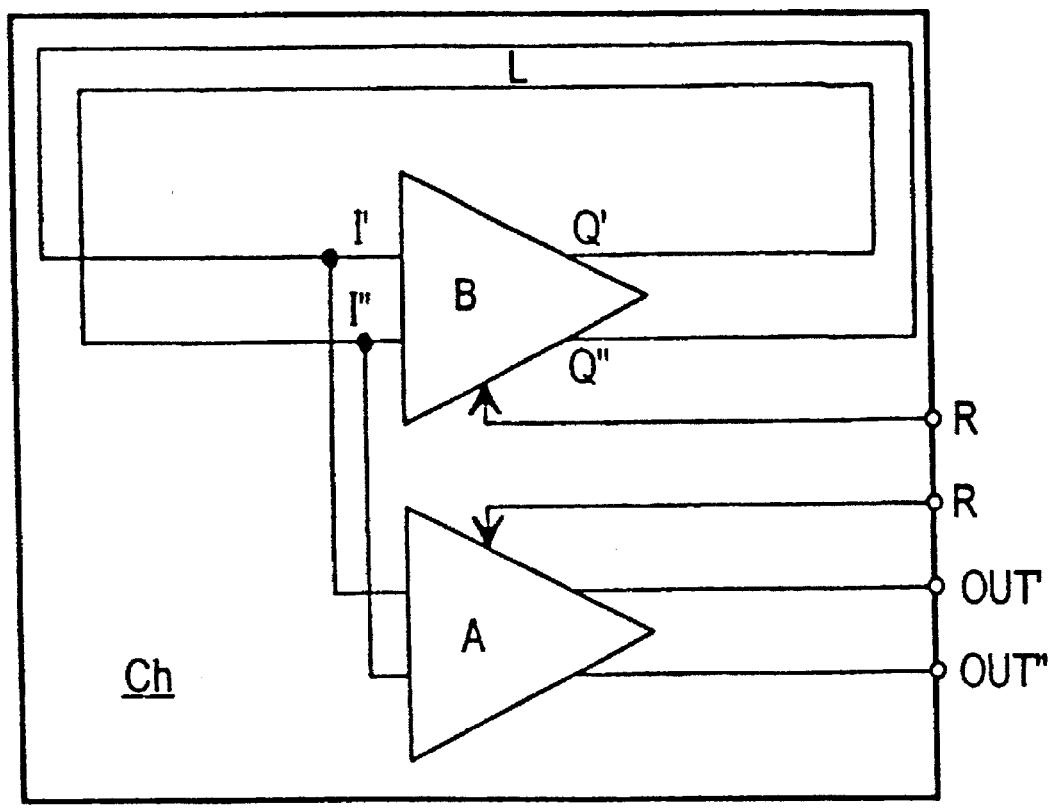
FIG. 2 is a block circuit diagram of an oscillator circuit of the invention.

The signal generated in the oscillator B,L is preferably conducted via an output amplifier A to the output OUT', OUT" of the oscillator circuit, as may be seen from FIG. 2. Line driver B and output amplifier A can be realized in the same way with a driver circuit, as outlined, for example, in FIG. 3.

Figure 3:
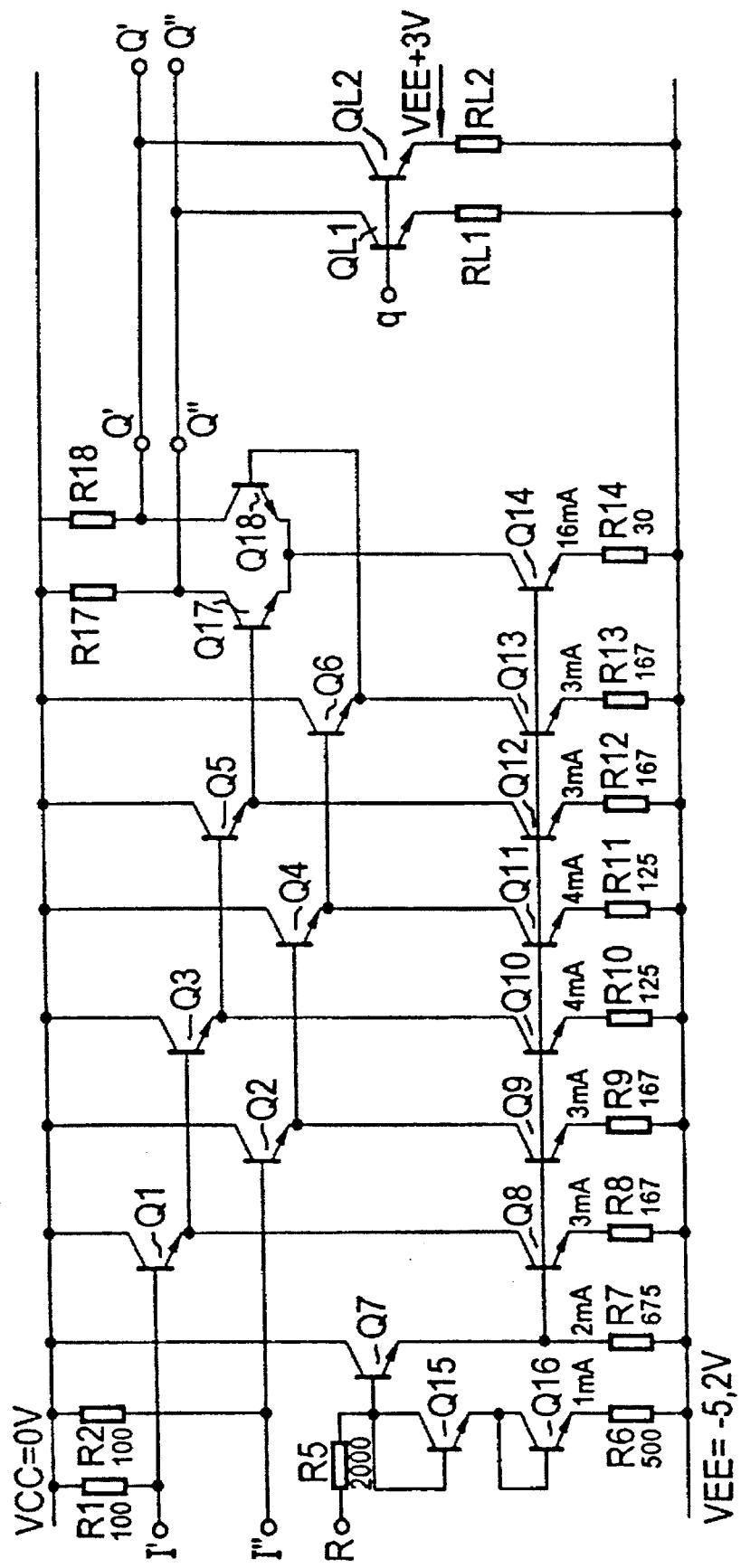
FIG. 3 shows circuit-oriented details of a line driver.

In the line driver circuit shown in FIG. 3, the levels of the signals fed back via the double line L (in FIGS. 1 and 2) are shifted with the assistance of current source-fed transistors Q1,Q3,Q5 or Q2,Q4,Q6, and are then supplied to a differential amplifier having two emitter-coupled transistors Q17, Q18 whose outputs form the driver outputs. A bias for the current source transistors Q8 through Q14 that can be set at a pin R is generated with the transistors Q15,Q16 and Q7 and the resistors R5, R6 and R7.

Values of resistance are indicated in Ohms for the exemplary embodiment in FIG. 3, whereby the resistors R17, R18 in the line driver preferably have a value of resistance of 100 Ω and, in the output amplifier, a value of resistance of 50 Ω. The values of current indicated in FIG. 3 are valid for full drive or modulation of the circuit at the input R.

Given a line ring oscillator formed with such a line driver circuit, the oscillator frequency can fluctuate by 2.5% in the temperature range from 25° through 125° C. and in the scatter range specified by the semiconductor manufacturers. This high precision is critically important for use in clock recovery circuits.

The sensitivity of the oscillator frequency to relative changes of the line driver current amounts to about 0.1, i.e. the oscillation frequency changes by 1% given a 10% change in current. Given use in a phase-locked loop (for example for clock recovery), the oscillator can thus be tuned to a specific reception frequency by appropriate drive or modulation of the line driver B proceeding from its control input R (in FIGS. 2 and 3).

The oscillation frequency can also be influenced in that the line L (in FIGS. 1 and 2) is loaded with controllable capacitances. This can occur, for example, with voltage-dependent junction capacitors, as likewise shown in FIG.3. According to FIG.3, the collector junction capacitance of the transistors QL1 and QL2 loads the outputs Q' and Q" and thereby effects an additional signal delay. When the direct current flowing through these transistors proceeding from the control input q is raised, then the average voltage at the driver outputs Q' and Q" drops due to the additional voltage drop-off at the differential amplifier output resistors R18 and R17. Due to what is thus a lower collector-base voltage, the collector junction capacitance of both the load transistors QL1 and QL2 as well as the power switch transistors Q18 and Q17 increases, and the delay becomes longer. The driver inputs I',I"(in FIGS. and 2) will therefore be preferably capacitatively coupled to the line L (in FIGS. 1 and 2) in order to prevent the base potential of the power switch transistors Q18 and Q17 from becoming too low. Without this having to be shown in detail here, further junction capacitors can also be distributed over the entire course of the line L.

Although various minor changes and modifications might be proposed by those skilled in the art, it will be understood that we wish to include within the claims of the patent warranted hereon all such changes and modifications as reasonably come within our contribution to the art.

We claim as our invention:

1. A monolithically integrated ring oscillator, comprising:
a line driver having first and second inputs and first and second outputs, and a double line that feeds back from the first and second outputs to the second and first inputs of the line driver;
the double line being integrated and having an optimally long running time and the line driver having an optimally short delay time; and
the line driver and the double line being integrated on a same chip.

2. The monolithically integrated oscillator according to claim 1 wherein a cycle duration of oscillations of the oscillator corresponds to twice a sum of said delay time of the line driver and said running time of said double line.

3. The monolithically integrated oscillator according to claim 1 wherein said running time of the double line is longer than said delay time of the line driver.

4. The monolithically integrated oscillator according to claim 1 wherein the oscillator signal is conducted to an output via an output amplifier.

5. The monolithically integrated oscillator according to claim 4 wherein said line driver and said output amplifier are provided with identical driver circuits.

6. The monolithically integrated oscillator according to claim 1 wherein said double line is formed by first and second interconnects which proceed side-by-side over a metal surface lying at ground potential.

7. The oscillator according to claim 6 wherein the double lines cross over each other.

8. The monolithically integrated oscillator according to claim 1 wherein said double line is loaded with capacitors.

9. The monolithically integrated oscillator according to claim 8 wherein said double line is loaded with controllable capacitors.

10. A monolithically integrated ring oscillator, comprising:
a line driver having first and second inputs and first and second outputs;
a double line formed of a first line connecting the first output to the second input and a second line connecting the second output to the first input, and wherein said double line has a cross-over between the inputs and the outputs;
said double line being integrated and having an optimally long running time and the line driver having an optimally short delay time; and
the line driver and the double line being integrated on a same chip.

11. The monolithically integrated ring oscillator according to claim 10 wherein a first portion of the double line running from the first and second outputs to the cross-over has the first and second lines parallel to one another and lying over a metal surface at ground potential, and wherein from the cross-over to the first and second inputs the first and second lines of the double line are parallel to one another and also lie over the metal surface, said metal surface being at ground potential.

* * * * *